United States Patent [19]
Moore

[11] Patent Number: 4,971,554
[45] Date of Patent: Nov. 20, 1990

[54] MULTI-NOZZLE SURFACE MOUNT REWORK SYSTEM

[75] Inventor: Arthur H. Moore, Fillmore, Calif.

[73] Assignee: Semiconductor Equipment Corporation, Moorpark, Calif.

[21] Appl. No.: 238,055

[22] Filed: Aug. 30, 1988

[51] Int. Cl.$^5$ .......................... F27D 7/00; B23K 1/00
[52] U.S. Cl. ...................................... 432/19; 350/169; 432/225; 432/226; 228/19; 228/20
[58] Field of Search ...................... 432/10, 19, 20, 33, 432/212, 225, 224, 226; 350/169; 228/19, 20 R

[56] References Cited

U.S. PATENT DOCUMENTS

| | | | |
|---|---|---|---|
| 1,956,519 | 4/1934 | Thomson | 432/225 |
| 2,745,479 | 5/1956 | Young | 432/225 |
| 3,536,306 | 10/1970 | Selivanov et al. | 432/225 |
| 3,732,066 | 5/1973 | Kipple et al. | 432/225 |
| 4,451,233 | 5/1984 | Lachenmeier et al. | 432/225 |
| 4,488,871 | 12/1984 | Cremer | 432/19 |
| 4,515,562 | 5/1985 | Williams | 432/226 |
| 4,626,205 | 12/1986 | Barkley et al. | 432/225 |
| 4,817,851 | 4/1989 | Kolesar et al. | 228/20 |
| 4,832,250 | 5/1989 | Spigarelli et al. | 228/19 |

*Primary Examiner*—Henry C. Yuen
*Attorney, Agent, or Firm*—Kenneth E. Darnell

[57] ABSTRACT

Apparatus for rapidly and precisely removing and replacing surface mount devices without disturbance to nearby devices on a printed circuitboard, the invention utilizes a multiple nozzle arrangement wherein nozzles arranged for reciprocating motion one each along each edge of a surface mount device direct low velocity hot gas against bond joint locations along the respective edges of the surface mount device, thereby to melt the bonding agent mounting the device to the circuitboard. The multiple nozzle arrangement of the present system thus allows removal and/or replacement of devices of widely varying dimensions without the need for changes in nozzle size such as is inherent in prior art hot gas rework stations.

71 Claims, 4 Drawing Sheets

MULTI-NOZZLE SURFACE MOUNT REWORK SYSTEM

BACKGROUND OF THE INVENTION

1. Field of the Invention

The invention relates generally to apparatus for removing surface mount devices from circuit boards and particularly relates to a multiple nozzle rework system capable of removing devices of widely varying sizes without nozzle changes.

2. Description of the Prior Art

Hot gas rework stations previously available in the art have been used for rapidly and easily attaching and removing surface mounted components to and from printed circuit boards without disturbing nearby components or damaging the device being removed or mounted to the board. An example of such a prior art system is the Model 4460 Hot Gas Rework Station manufactured by Semiconductor Equipment Corporation of Moorpark, Calif., this prior rework system comprising a sophisticated apparatus utilizing a single interchangeable nozzle through which hot nitrogen gas is directed. Since a hot nitrogen gas jet must be directed in an extremely concentrated area to permit surface mount component removal without heating adjacent components, a multiplicity of nozzles which are interchangeable in the apparatus must be provided for surface mount components of differing dimensions. A fact of life in prior surface mount rework systems is the requirement for nozzles of differing sizes which are interchangeable to allow an operator to move and replace devices of different sizes on a printed circuit board.

Hot gas reworking tools are disclosed in a number of prior patents including those noted as follows:

4,295,596 Broten et al
4,366,925 Fanene
4,426,571 Beck
4,552,300 Zovko et al
4,602,733 Slack et al
4,605,152 Fridman
4,620,559 Holdway
4,696,096 Green The patents noted above require a change of nozzles or similar gas-directing structure in order to work with surface mount devices of differing sizes. The patents are thus representative of prior art apparatus which require nozzle changes in order that surface mount devices of differing sizes can be removed and/or replaced on printed circuit boards by precise hot gas techniques.

The present invention thus provides improvement over the prior art by the provision of multiple nozzles arranged for reciprocating movement so that hot gas can be precisely directed to bond joint locations of surface mount devices, thereby allowing removal and replacement without the requirement for maintaining a large inventory of nozzles of differing sizes and dimensions and without wasting time necessary for changing nozzles.

SUMMARY OF THE INVENTION

The invention provides a universal rework system capable of rapidly and precisely removing and replacing surface mount devices of virtually all sizes and styles without the need for changing nozzles. Surface mount devices mounting on printed circuit boards or similar substrates include epoxy bonded die, eutectic bonded die and leadless chip carriers inter alia. In common with prior hot gas rework systems, the present apparatus preferably uses nitrogen gas directed precisely against bond joint locations at low velocity, the temperature of the gas typically being as high as 800° C. The present apparatus exhibits versatility not previously available in the art by the provision of multiple nozzles which allow rework of surface mount devices of varying size and configuration and which, in the prior art, could only be reworked through an interchange of a large number of different nozzle styles and configurations. With a multiple nozzle arrangement, typically four nozzles arranged with each nozzle being reciprocable essentially along one side of an imaginary rectangle, the apparatus of the invention is capable of directing very hot gas to particular locations necessary for removing or replacing surface mount devices on a substrate without undue heating of adjacent devices and without damage to the device being worked. The apparatus of the invention is capable of such performance without the requirement for time-consuming interchange of nozzles of differing configurations which previously had to be used for rework of devices of differing configuration and size. Use of the present apparatus thus eliminates the need for down time involved in the interchange of nozzles necessary in the prior art. A user of the present rework system is also not required to maintain an inventory of nozzles of differing sizes and configurations in order to work a full range of surface mounted devices as has been necessary in the prior art.

Accordingly, it is a primary object of the present invention to provide a surface mount rework system capable of removing and replacing surface mount devices both quickly and easily without disturbance or damage to nearby devices and without the need to change nozzles when working surface mount devices of differing styles, sizes and configurations.

It is another object of the invention to provide a surface mount rework system using multiple nozzles arranged to direct low velocity hot gas against bond joint locations at edges of a surface mount device in order to facilitate rework of the device on a printed circuit board or similar substrate.

It is a further object of the present invention to provide a multi-nozzle surface mount rework system which is sufficiently versatile to allow rework of surface mount devices without damage to the devices or to devices adjacent to the rework location and without the need for time-consuming nozzle changes when working with devices of different sizes and configurations and further without the need for maintaining an inventory of nozzles of differing sizes and configurations which would need to be interchanged on a rework apparatus depending upon the size and configuration of the devices being reworked.

Further objects and advantages of the invention will become more readily apparent in light of the following detailed description of the preferred embodiments.

DESCRIPTION OF THE PREFERRED EMBODIMENTS

The apparatus of the invention has substantial similarity to the Model 4460 Surface Mount Rework System produced by Semiconductor Equipment Corporation of Moorpark, Calif. 93021 in that a number of subsystems of the prior art Model 4460 can be utilized in the present apparatus. As an example, the prior art Model 4460 as well as other devices available in the art provide means for heating gas to a temperature sufficient for use in a rework system as well as providing means for directing the heated gas to a nozzle for use. As another example, the prior art provides video camera, video monitor and similar subsystems for viewing of the work location, such subsystems being similar to subsystems employed in the present apparatus. Electronic and vacuum systems employed in prior devices such as the Model 4460 and which can be utilized in the present apparatus are thus conventional and are not considered to be novel features of the present apparatus. Accordingly, the operation of such conventional subsystems will not be described herein since the person of ordinary skill in the art will readily understand the operation and utilization of such subsystems in the embodiments of the present invention.

Figure 1:
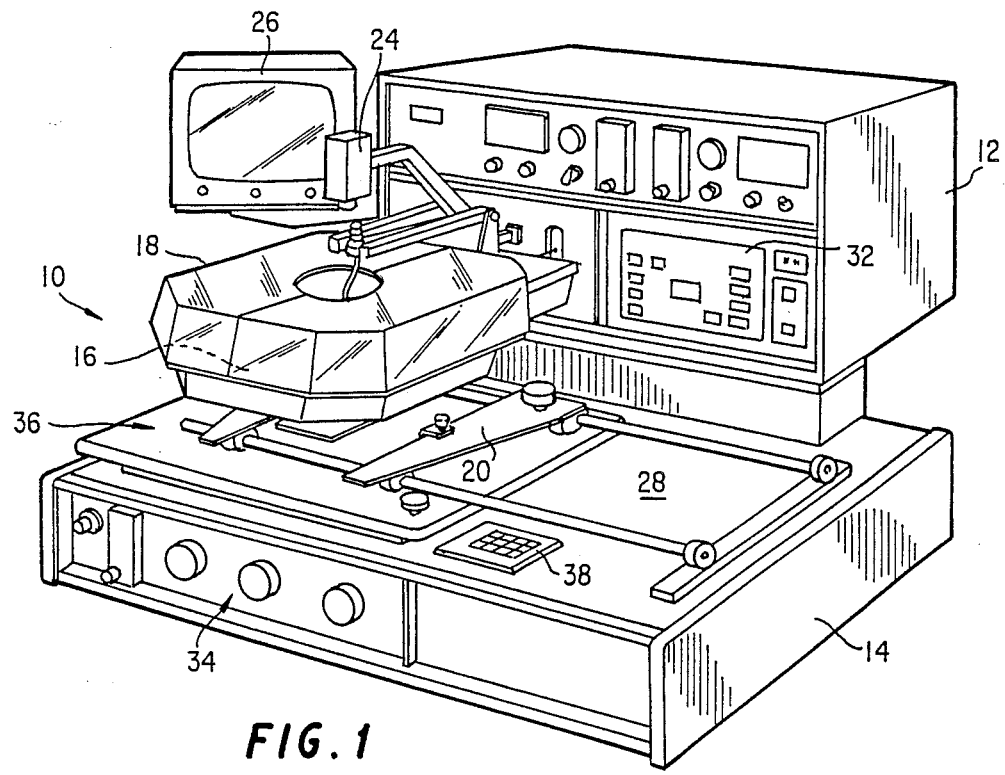
FIG. 1 is a perspective view of an apparatus of the present surface mount rework system and which particularly illustrates system components.
Figure 2:
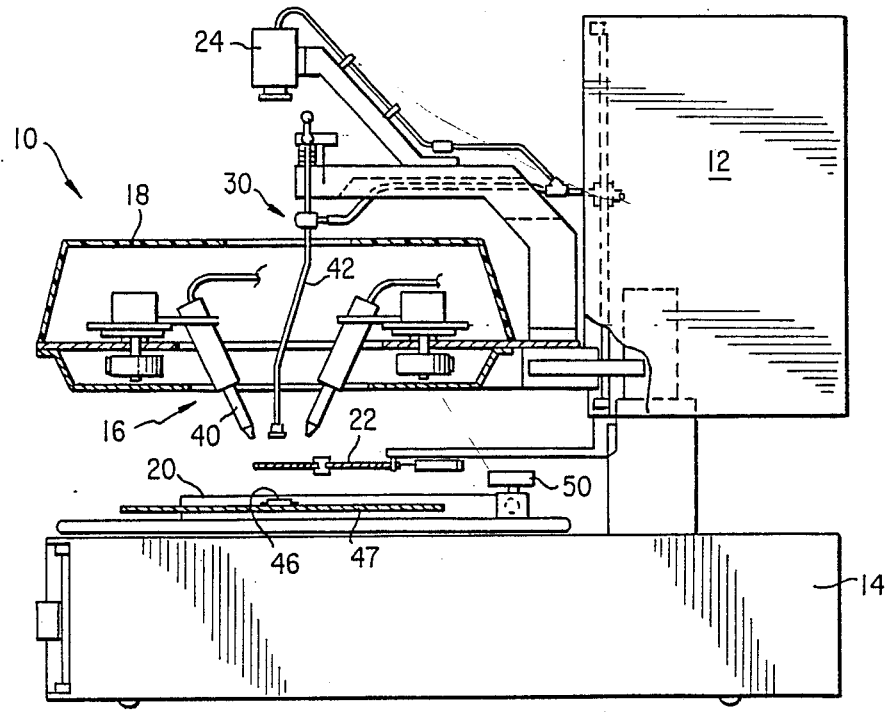
FIG. 2 is an elevational view of the apparatus of FIG. 1.

Referring now to the drawings, and particularly to FIGS. 1 and 2, the present multi-nozzle surface mount rework system is seen at 10 to comprise a control console 12 and a work console 14, the work console 14 mounting nozzle assembly 16 within nozzle assembly housing 18. The nozzle assembly 16 will be further described herein to mount a plurality of nozzles, preferably four nozzles, which allows the system 10 to rework virtually all styles and configurations of surface mount devices without the requirement for changing nozzles as has been necessary in the prior art. The system 10 allows ready adjustment of the nozzle assembly 16 to accommodate surface mount devices of any size from 0.1" on its smallest dimension to ob 2.0" on its largest dimension. The system 10 further accommodates rectangular as well as square surface mount devices and also accommodates devices with contacts on one, two or four sides. These capabilities are accomplished without the removal and replacement of nozzles. When the system 10 is called on to accommodate a surface mount device of differing size or shape, the system 10 is reset via motorized adjustment with video display to handle each different style and shape of device, the adjustment being accomplished within seconds as will be described hereinafter.

A board holder 20 is configured to hold a printed circuit board (not shown) on which surface mount devices (not shown) are to be reworked, that is, to be removed or to be replaced with debonding and bonding occurring through the precise direction of low velocity hot gas against bond joint locations. The board holder 20 forms a part of a two-position work surface 36 immediately below the nozzle assembly 16.

As will be described further hereinafter, an optical system comprising a video camera 24 and video monitor 26 enables an operator of the system 10 to view the work area, an image splitter 22 allowing viewing of a surface mount device being reworked while simultaneously viewing the nozzle assembly 16 as will be described hereinafter relative to FIG. 4. Prior rework systems have used video equipment in order to facilitate working of surface mount devices. Accordingly, the structure and operation of this equipment will not be described in detail.

A vacuum pick up 30 is provided at a location central of the nozzle assembly 16 in order that the surface mount devices can be handled without damage to the devices. The vacuum pick up 30 will be further described relative to FIG. 3.

A preparation station 28 can be provided on the work console 14 adjacent to the work surface 36. The preparation of section 28 is optional and similar structure has been available in the prior art.

A status panel 32 is disposed on a forward face of the control console 12 in order that the status of the nozzle assembly 16 can be readily determined. Control of the nozzle assembly 16 is accomplished through keypad 38 disposed on the work console 14 in a location convenient for user manipulation. Position controls 34 are also provided in the work console 14 in order to control the location of the board holder 20 in X, Y and theta motions. The particular mechanisms employed for printed circuit board positioning by the board holder 20 as well as the electronics employed for control functions within the system 10 are conventional in the art. Accordingly, a detailed discussion of the structure and function of these conventional systems need not be provided herein.

Figure 3:
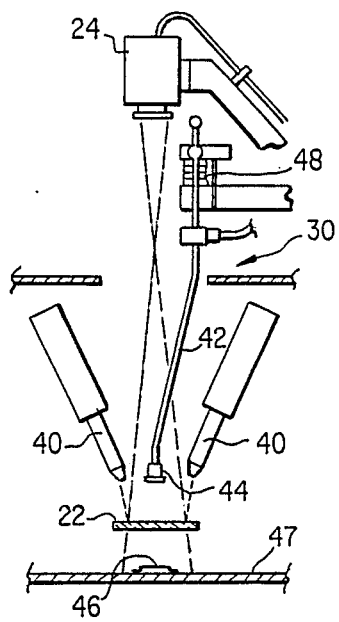
FIG. 3 is a detail elevational view of a vacuum pickup subsystem of the apparatus.
Figure 4:
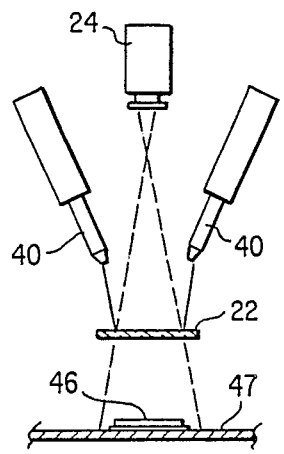
FIG. 4 is an idealized elevational view of an optical arrangement utilized to facilitate viewing of the rework location.

Referring particularly to FIGS. 2, 3 and 4, the nozzle assembly 16 can be seen to include nozzles 40 through which low velocity hot gas is directed against precise locations along edges of a surface mount device (not shown) which is to be reworked according to the invention. In FIGS. 2, 3 and 4, only two nozzles are shown for ease of illustration of the image splitter 22 and the vacuum pick up 30. In a preferred embodiment of the invention as will be described hereinafter, four of the nozzles 40 are utilized in order to provide the greatest degree of versatility in the reworking of surface mount devices of differing size and configuration.

The vacuum pick up 30 comprises a vacuum tube 42 having a contact head 44 located at its distal end, the other end of the vacuum tube 42 being connected to a source of vacuum (not shown) in a conventional manner. The vacuum tube 42 is either curved or "offset" along its length in order that the video camera 24 can be provided with an unobstructed view of the nozzles 40 and surface mount device 46 positioned on the board holder 20. When a device 46 is to be removed, the vacuum pick up 30 is lowered into place above the device 46 and vacuum is actuated. Once the hot gases emanating from the nozzles 40 cause reflow of bonding material to occur, the device 46 is lifted from board 47. An adjustable spring-loaded assembly 48 located at the anterior end of the vacuum tube 42 facilitates lifting of the device 46 at the exact moment when reflow occurs. The curved or offset shaping of the vacuum tube 42 is an important feature of the invention in that an operator of the system 10 can readily view the device 46 and the nozzles 40 through the video monitor 26 without substantial obstruction. When the surface mount device 46 is lifted off by the vacuum pick up 30, the nozzle assembly 16 retracts upwardly, thus allowing clearance to move the board holder 20 out from under the nozzle assembly 16 for ease of inspection, clean up and the like. Contact heads 44 of differing sizes can be interchanged at the distal end of the vacuum tube 42 to allow use of the vacuum pick up 30 with components of differing sizes including very small components.

As can also be seen in FIGS. 2, 3 and 4, an image splitter 22 is seen to be retractably disposed between the distal ends of the nozzles 40 and the surface mount device 46 which is to be reworked. The image splitter 22 essentially comprises an image splitting mirror which allows downward viewing toward the device 46 while simultaneously allowing upward viewing of the nozzles 40 with the two views being superimposed and displayed on the video monitor 26. Accordingly, both the device 46 which is to be either removed or installed and the nozzles 40 can be simultaneously viewed by a user of the system 10 thus guaranteeing alignment of the nozzles 40 with respect to the device 46. This viewing occurs with the nozzle assembly 16 in an up position. Retraction of the image splitter 22 and subsequent lowering of the nozzle assembly 16 retains the precise alignment of nozzles 40 and surface mount device 46. The sweep range and position of the nozzles 40 can be adjusted with the nozzle assembly in the up position and with the nozzles in motion once alignment through the use of the image splitter 22 has been accomplished.

The board holder 20 functions to hold printed circuit boards or similar substrates such as the board 47 for reworking. Once the board 47 is locked into an approximate alignment within the board holder 20, the board 47 can be finely located in X, Y and theta by utilizing fine adjustment knobs provided by the position controls 34. Knob assembly 50 best seen in FIG. 2 allows lock down of the board 47 in approximate alignment.

Figure 5:
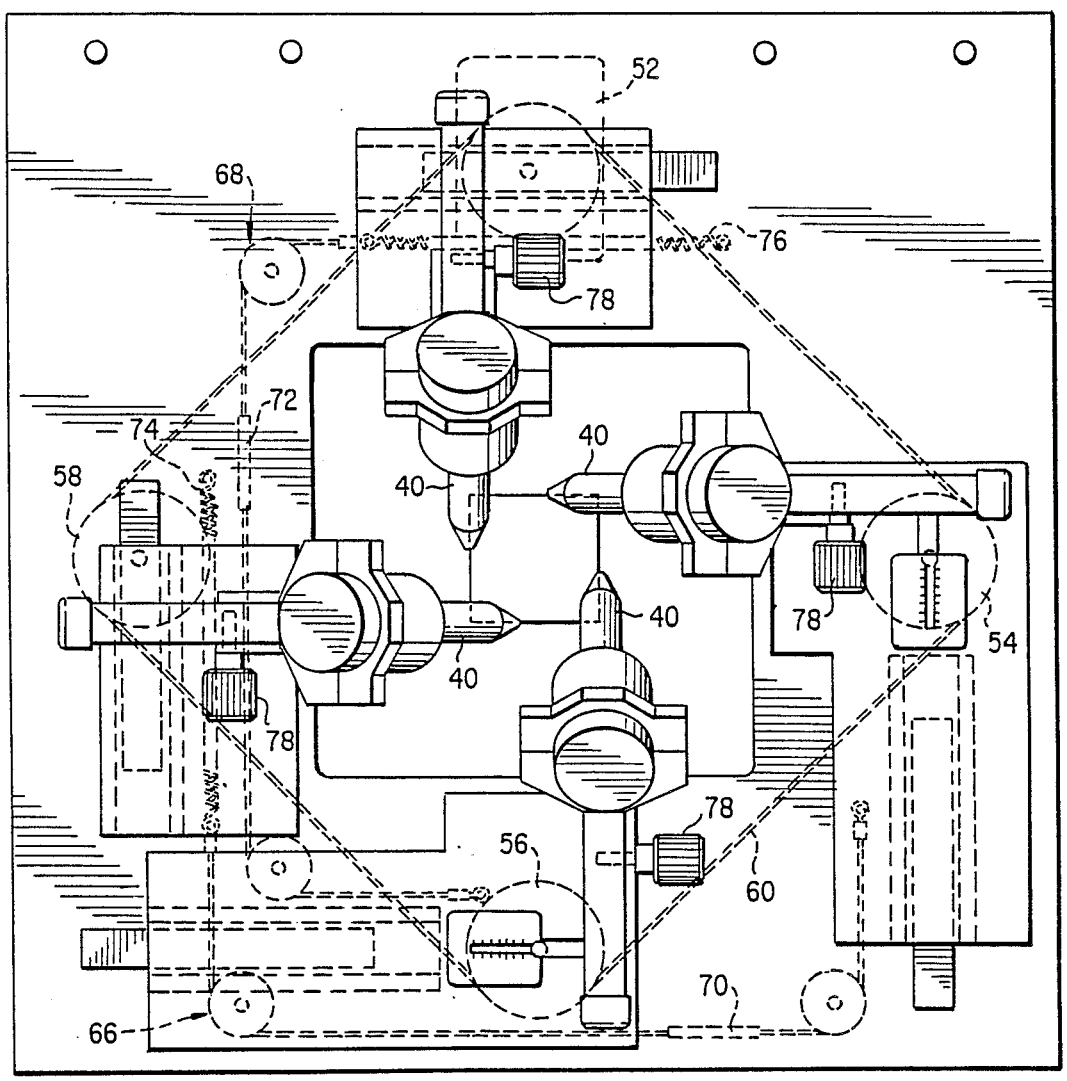
FIG. 5 is a plan view of the multiple nozzle arrangement of the invention.
Figure 6:
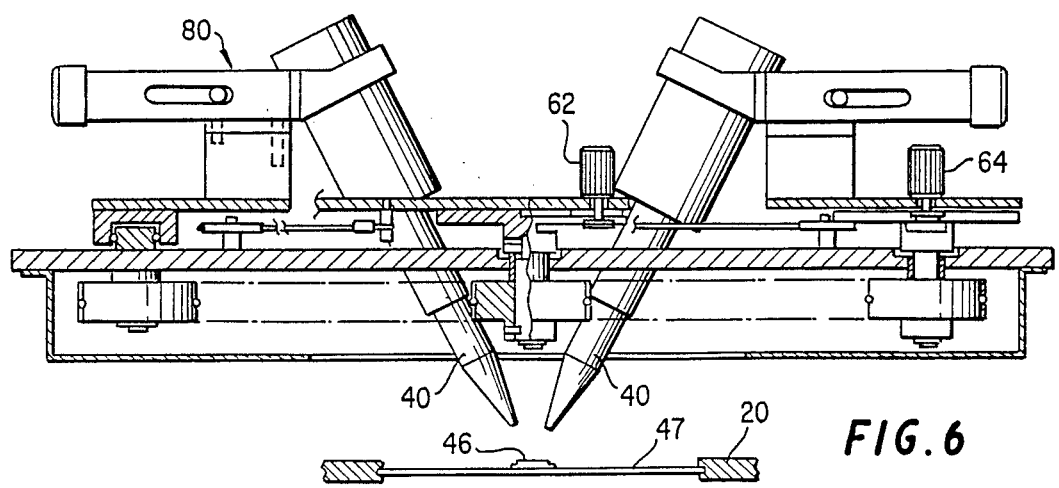
FIG. 6 is an elevational view taken along lines 6—6 of FIG. 5.
Figure 8:
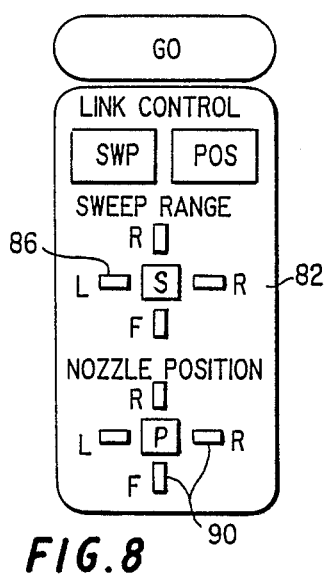
FIG. 8 is a schematic of a display panel used for control of the apparatus.
Figure 9A:
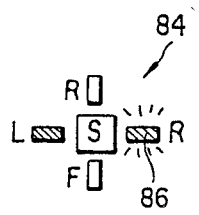
FIGS. 9A and 9B, 9C and 9D are schematics of indicator combinations displaying the sweep range of the nozzles on the panel of FIG. 8.
Figure 9B:
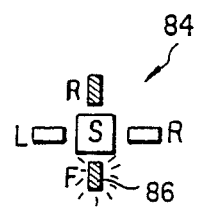
Figure 9C:
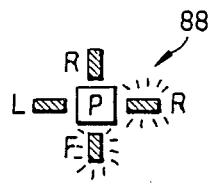
Figure 9D:
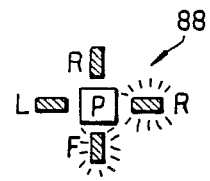
Figure 12:
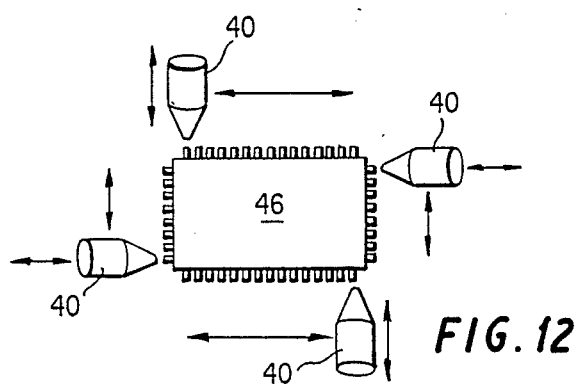

Although not shown in the drawings, the system 10 can be provided with a "backside" heater for preventing thermal shock to surface mounted devices on a board such as the board 47. Backside heaters have previously been utilized in systems such as the Model 4460 of Semiconductor Equipment Corporation referred to above. The backside heater effectively provides gas flow and temperature control along with a timing function to prompt the operator of the system 10 at the end of the preheating cycle. The backside heater is located in a fixed position in close proximity to the under side of the board 47, the heater being mounted in the work console 14 immediately below the board holder 20. The amount of thermal energy applied for preheating of the board 47 is controlled by gas flow and temperature controls (not shown) as is conventional in the art. Referring now to FIGS. 5, 6 and 12, the nozzle assembly 16 is shown in a preferred embodiment to comprise four of the nozzles 40 for delivering low velocity hot gas to precise locations along edges of a surface mount device such as the device 46 as schematically seen in FIG. 12. In FIGS. 5 and 6, the nozzles 40 are seen to each reciprocate along one side of an area within which a surface mount device 46 is to be removed or replaced on the board 47. Proper functioning of the system 10 is dependent upon heating of a gas such as nitrogen to a very high temperature and applying the concentrated thermal energy available in the gas directly to a location where a bonding material is to be melted. The nozzle assembly 16 must be accurately raised and lowered into position in order to facilitate proper application of the low velocity hot gas. In order to allow the nozzles 40 to be more easily seen in FIG. 5, the angle of the nozzles 40 shown at approximately 30° from the vertical. In actual practice, a preferred range of angles is between 18 and 20°. As is schematically seen in FIG. 12, the four nozzles 40 each have two degrees of motion relative to the surface mount device 46. The distance which each nozzle 40 travels along an edge of the device 46 is referred to as the "sweep range" while the proximity of each nozzle 40 to the surface mount device 46 is referred to as the "nozzle position". The nozzles will be referred to for purposes of discussion as the right, left, front and rear nozzles 40. In operation, the left and right nozzles 40 can be electronically linked together such that change of the "sweep range" of the left nozzle 40 correspondingly changes the "sweep range" of the right nozzle 40 simultaneously. A single adjustment thus controls the sweep range of both the left and right nozzles. In a similar manner, the sweep ranges of the front and rear nozzles 40 are linked together with one adjustment controlling both nozzles. Each pairing of the nozzles 40 as noted above can further be linked together such that a change in "nozzle position" of one also changes the nozzle position of the other simultaneously. Further, all four nozzles 40 can be linked together as to both position and sweep range function for rapid alignment in handling surface mount devices 46 which are square in conformation. Each pair of nozzles, that is, left and right or front and rear, can be retracted and/or functionally disabled when removing or replacing a device 46 with contacts on only two sides. Further, a single nozzle 40 can be used singly to remove and replace "in-line" or very small components on a substrate.

The sweep cycle of a nozzle is always the same, the sweep cycle being the time required for travel of a nozzle 40 down a row of contacts of a device 46 and back to the initial nozzle position. Accordingly, balancing of thermal input and matching of reflow time on adjacent sides of a rectangular device requires separate gas temperature and gas flow controls with one set of controls for the left and right nozzles 40 and a second set of controls for the front and rear nozzles 40. Either of the controls can be shut down entirely when working with surface mount devices which have contacts on two sides only. When the system 10 is initially actuated, all four nozzles can be brought up to a fixed idle temperature for fast response. A timer (not shown) can also be provided for associated heating equipment for assisting with uniform cycle duration and for preventing overheating. As has been noted previously, the lifting of a device 46 by the vacuum pick up 30 results in nozzle assembly 16 retraction upwardly with heating elements being cut back to an idle temperature. A pressure interlock (not shown) can also be provided to prevent heater burnout in the event of low gas pressure.

Referring now particularly to FIGS. 5 and 6, it is to be seen that the nozzles 40 are generally located in an orientation corresponding to the left, right and front, rear pairings shown in FIG. 12. Movement of the pairs of nozzles 40 in the "sweep range" mode occurs through driving of a gear motor 52 tied to sprockets 54 and 56 and idler pulley 58 by means of cable 60. Manual adjustment of the sweep range is accomplished by range setting knobs 62 and 64 associated with the sprockets 54 and 56 respectively so that the nozzles 40 are controlled as to the extent of the sweep range desired in a given rework situation. Nozzle position is controlled by the two cable and pulley assemblies 66 and 68. The assemblies 66 and 68 have turnbuckle adjustment elements 70 and 72 to maintain cable tightness. Each assembly 66 and 68 have respective return spring 74 and 76 which return respective nozzles 40 to an initial position as set by respective thumbscrew 78.

Each nozzle 40 is held within a nozzle mounting assembly 80 with the assemblies 80 being mounted for reciprocating movement so as to allow accomplishment of the sweep range function noted above. It is to be understood that electric motors such as miniature stepper motors (not shown) can be employed for movement of the nozzles 40, these motors being capable of electronic linkage for appropriate positioning of the nozzles 40. The nozzles 40 can thus be controlled by apparatus other than as specifically shown and described herein.

Figure 7:
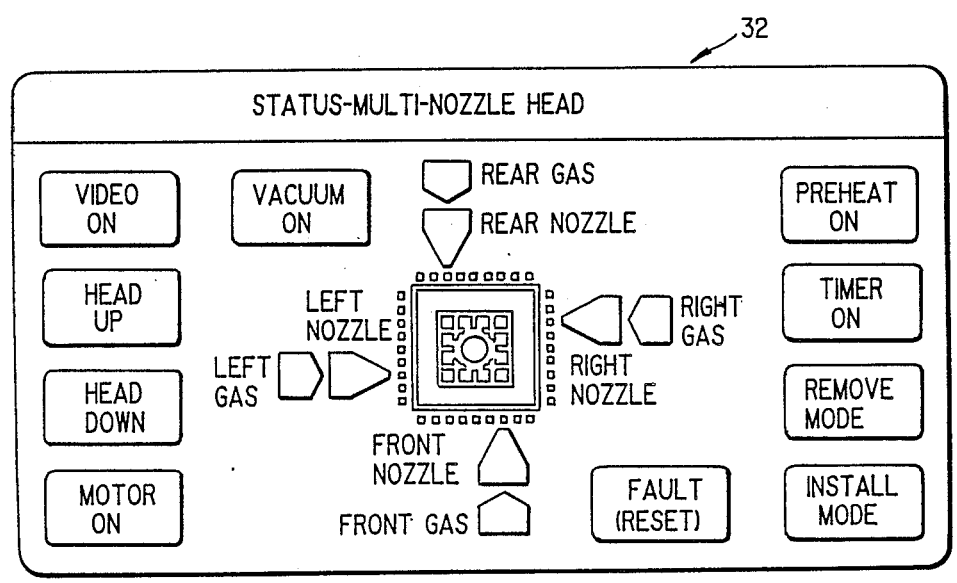
FIG. 7 is a schematic of a membrane switch/display panel used for control of the apparatus.

Referring now to FIG. 7, the status panel 32 essentially comprises a membrane switch/display panel which displays information as to the status of the nozzles 40. Control of the system 10 can further be provided through the status panel 32. As an example, the indicators of system functions can be caused to be eliminated or to flash to provide an indication of system condition. Further, the positions of the nozzles 40 can be schematically represented and the condition of gas flow to the nozzles can be shown on the panel 32.

As noted relative to FIG. 8 and FIGS. 9A through 9D, the linkage between the pairs of nozzles 40 can be controlled through use of the link control panel 82. Sweep range display 84 is noted in FIGS. 9A and 9B as comprising pairs of flashing lights 86 which indicate respective linkages of left and right nozzles and front and rear nozzles. Both pairs of nozzles 40 can be linked together as aforesaid with resultant flashing of all of the lights 86 either alternately or together depending upon particular linkage of the pairs of nozzles 40. Similarly, nozzle position is shown by nozzle position display 88 comprising flashing lights 90.

Figure 10:
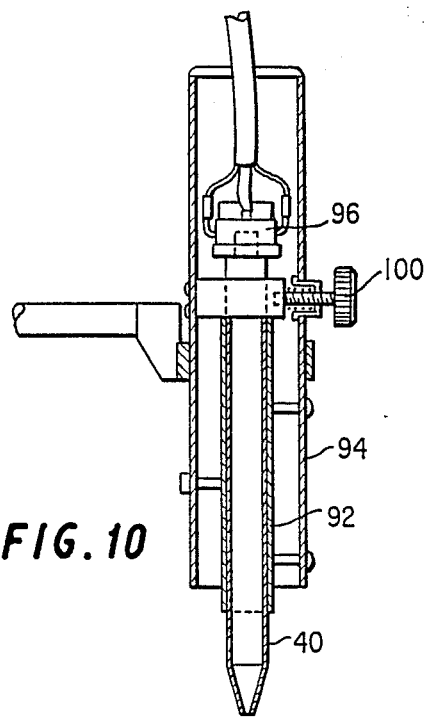
FIG. 10 is an elevational view in partial section of a hot gas nozzle assembly of the invention.
Figure 11:
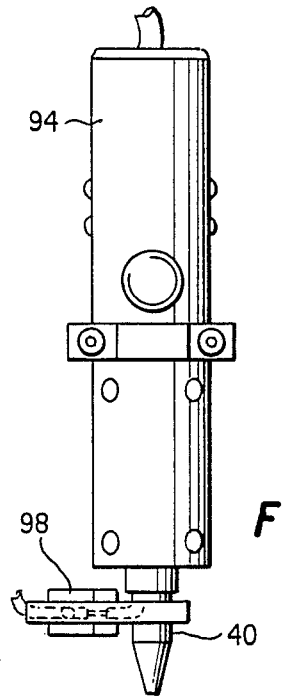
FIG. 11 is an elevational view of a hot gas nozzle assembly of the invention; and, FIG. 12 is a schematic illustrating the positions of the several nozzles of the invention during rework of a surface mount device.

Referring now to FIGS. 10 and 11, a nozzle 40 is seen in one embodiment of the invention to be maintained within inner and outer heat shields 92 and 94. Heating of the nozzle 40 can be accomplished by means of heater 96 with heat indication being provided by thermocouple 98. Position adjustment of the nozzle 40 within the heat shield 94 can be provided by spring loaded adjustment knob 100.

It is to be understood that the invention can be practiced other than as explicitly described herein without departing from the scope of the invention. Mechanical and electronic subsystems and features not described in detail constitute conventional and readily available subsystems including gas heating subsystems, electronic control subsystems, backside heating subsystems, vacuum subsystems, etc. In its most basic mode, the invention contemplates the provision in a surface mount rework system of multiple nozzles capable of independent and coordinate movement for directing low velocity hot gas to precisely selected locations for either removing or replacing surface mount devices on a printed circuit board or similar substrate.

What is claimed is:

1. In combination, an apparatus for removing or replacing surface mount devices on a substrate by melting of a bonding material along at least an edge portion of a device through application of a heated gas thereto including heating means for heating said gas and further comprising a nozzle assembly including a plurality of nozzles through which heated gas can be directed, each nozzle being positionable relative to a portion of said surface mount device to direct heated gas toward said device, and means for moving the nozzles either independently or in concert relative to the device to apply heated gas thereto.

2. In the apparatus of claim 1 wherein the surface mount device is rectangular and the nozzle assembly comprises four nozzles arranged to move one each along and relative to one side of the device.

3. In the apparatus of claim 1 and further comprising means for holding the device through the effects of a vacuum applied to an outer face of the device, the holding means comprising a vacuum tube through which the vacuum is directed, the tube having a curvature allowing a relatively unobstructed view of the device and of the nozzles when viewed from directly above the nozzles.

4. In the apparatus of claim 1 and further comprising image splitting means for simultaneously directing images of the device and of the nozzles to a viewing location, the image splitting means comprising split mirrors retractably interposed between the surface mount device and the nozzles and acting to superimpose images of the device and of the nozzles at the viewing location.

5. In the apparatus of claim 1 wherein the surface mount device is square and the nozzle assembly comprises four nozzles arranged to move one each along and relative to one side of the device.

6. In the apparatus of claim 1 wherein the moving means comprise means for controlling the sweep range of each nozzle, thereby allowing use of the apparatus with devices of differing edge dimension.

7. In the apparatus of claim 1 wherein the moving means comprise means for simultaneously controlling the sweep range of each pair of oppositely disposed nozzles, thereby to allow use of the apparatus with devices of differing edge dimension.

8. In the apparatus of claim 1 wherein the nozzle assembly further comprises at least one heat shield mounted over each nozzle the heating means comprises and a heater mounted to each nozzle for heating the nozzle, the heater being mounted within the heat shield.

9. In the apparatus of claim 8 and further comprising a second heat shield mounted interiorly of the first-mentioned heat shield, the nozzle being carried within the second heat shield.

10. In the apparatus of claim 8 and further comprising adjustment means carried by the heat shield for adjusting the position of the nozzle within the heat shield.

11. In the apparatus of claim 8 and further comprising means carried by the nozzle for indicating the heat level present in the nozzle.

12. In the apparatus of claim 1 wherein the moving means comprise means for controlling the position of each nozzle relative to the device.

13. In the apparatus of claim 1 wherein the moving means comprise means for simultaneously controlling the position of each pair of oppositely disposed nozzles.

14. In the apparatus of claim 1 and further comprising means disposed above the plane in which the device lies and being connected to the apparatus, for viewing the device and the nozzles juxtaposed relative thereto.

15. In the apparatus of claim 14 wherein the viewing means comprise a video camera and a video monitor.

16. In the apparatus of claim 1 wherein the angle of the nozzles relative to the vertical is within a range of 18° to 30 ° and preferably 18° to 20°.

17. In the apparatus of claim 2 wherein the moving means comprise means for controlling the sweep range and positions of the nozzles relative to the device, thereby allowing use of the apparatus with devices of differing edge dimension.

18. In the apparatus of claim 3 and further comprising spring means carried by the vacuum tube for pulling the device from the substrate immediately upon melting of the bonding material.

19. In the apparatus of claim 3 and further comprising contact means carried by the vacuum tube at the end thereof proximate to the device for sealingly contacting and holding the device on application of vacuum through the vacuum tube.

20. In the apparatus of claim 4 and improvement further comprises means disposed at the viewing location and being connected to the apparatus for viewing the device and the nozzles juxtaposed relative thereto.

21. In the apparatus of claim 20 wherein the viewing means comprise a video camera disposed at the viewing location and wherein the improvement further comprises a video monitor connected to the video camera for remote viewing of the device and the nozzles.

22. In the apparatus of claim 1 wherein the moving means comprise means for controlling the sweep range and positions of the nozzles relative to the device, thereby allowing use of the apparatus with devices of differing edge dimension.

23. In the apparatus of claim 22 and improvement further comprises means for holding the device through the effects of a vacuum applied to an outer face of the device, the holding means comprising a vacuum tube through which the vacuum is directed, the tube having a curvature allowing a relatively unobstructed view of the device and of the nozzles when viewed from directly above the nozzles.

24. In the apparatus of claim 23 and improvement further comprises spring means carried by the vacuum tube for pulling the device from the substrate immediately upon melting of the bonding material.

25. In the apparatus of claim 23 and improvement further comprises contact means carried by the vacuum tube at the end thereof proximate to the device for sealingly contacting and holding the device on application of vacuum through the vacuum tube.

26. In the apparatus of claim 22 and improvement further comprises image splitting means for simultaneously directing images of the device and of the nozzles to a viewing location, the image splitting means comprising split mirrors retractably interposed between the surface mount device and the nozzles and acting to superimpose images of the device and of the nozzles at the viewing location.

27. In the apparatus of claim 26 and improvement further comprises means disposed at the viewing location and being connected to the apparatus for viewing the device and the nozzles juxtaposed relative thereto.

28. In the apparatus of claim 27 wherein the viewing means comprise a video camera disposed at the viewing location and wherein the improvement further comprises a video monitor connected to the video camera for remote viewing of the device and the nozzles.

29. In the apparatus of claim 22 wherein the surface mount device is square and the nozzle assembly comprises four nozzles arranged to move one each along and relative to one side of the device.

30. In the apparatus of claim 22 wherein the nozzle assembly further comprises at least one heat shield mounted over each nozzle and the heating means comprises a heater mounted to each nozzle for heating the nozzle, the heater being mounted within the heat shield.

31. In the apparatus of claim 30 and further comprising a second heat shield mounted interiorly of the first-mentioned heat shield, the nozzle being carried within the second heat shield.

32. In the apparatus of claim 30 and further comprising adjustment means carried by the heat shield for adjusting the position of the nozzle within the heat shield.

33. In the apparatus of claim 30 and further comprising means carried by the nozzle for indicating the heat level present in the nozzle.

34. In the apparatus of claim 22 wherein the moving means comprise means for simultaneously controlling the sweep range of each pair of oppositely disposed nozzles, thereby to allow use of the apparatus with devices of differing edge dimension.

35. In the apparatus of claim 34 wherein the moving means comprise means for simultaneously controlling the position of each pair of oppositely disposed nozzles.

36. In the apparatus of claim 22 and further comprising means disposed above the plane in which the device lies and being connected to the apparatus, for viewing the device and the nozzles juxtaposed relative thereto.

37. In the apparatus of claim 36 wherein the viewing means comprise a video camera and a video monitor.

38. In the apparatus of claim 22 wherein the angle of the nozzles relative to the vertical is within a range of 18° to 30° and preferably 18° to 20 °.

39. In the apparatus of claim 7 wherein the surface mount device is rectangular and the nozzle assembly comprises four nozzles arranged to move one each along and relative to one side of the device.

40. In the apparatus of claim 7 and further comprising means for holding the device through the effects of a vacuum applied to an outer face of the device, the holding means comprising a vacuum tube through which the vacuum is directed, the tube having a curvature allowing a relatively unobstructed view of the device and of the nozzles when viewed from directly above the nozzles.

41. In the apparatus of claim 40 and improvement further comprises spring means carried by the vacuum tube for pulling the device from the substrate immediately upon melting of the bonding material.

42. In the apparatus of claim 40 and improvement further comprises contact means carried by the vacuum tube at the end thereof proximate to the device for sealingly contacting and holding the device on application of vacuum through the vacuum tube.

43. In the apparatus of claim 39 and improvement further comprises image splitting means for simultaneously directing images of the device and of the nozzles to a viewing location, the image splitting means comprising split mirrors retractably interposed between the surface mount device and the nozzles and acting to superimpose images of the device and of the nozzles at the viewing location.

44. In the apparatus of claim 43 and improvement further comprises means disposed at the viewing location and being connected to the apparatus for viewing the device and the nozzles juxtaposed relative thereto.

45. In the apparatus of claim 44 wherein the viewing means comprise a video camera disposed at the viewing location and wherein the improvement further comprises a video monitor connected to the video camera for remote viewing of the device and the nozzles.

46. In the apparatus of claim 7 wherein the surface mount device is square and the nozzle assembly comprises four nozzles arranged to move one each along and relative to one side of the device.

47. In the apparatus of claim 7 wherein the nozzle assembly further comprises at least one heat shield mounted over each nozzle the heating means comprises and a heater mounted to each nozzle for heating the nozzle, the heater being mounted within the heat shield.

48. In the apparatus of claim 47 and further comprising a second heat shield mounted interiorly of the first-mentioned heat shield, the nozzle being carried within the second heat shield.

49. In the apparatus of claim 47 and further comprising adjustment means carried by the heat shield for adjusting the position of the nozzle within the heat shield.

50. In the apparatus of claim 47 and further comprising means carried by the nozzle for indicating the heat level present in the nozzle.

51. In the apparatus of claim 7 wherein the moving means comprise means for controlling the position of each nozzle relative to the device.

52. In the apparatus of claim 7 wherein the moving means comprise means for simultaneously controlling the position of each pair of oppositely disposed nozzles.

53. In the apparatus of claim 7 and further comprising means disposed above the plane in which the device lies and being connected to the apparatus, for viewing the device and the nozzles juxtaposed relative thereto.

54. In the apparatus of claim 53 wherein the viewing means comprise a video camera and a video monitor.

55. In the apparatus of claim 7 wherein the angle of the nozzles relative to the vertical is within a range of 18° to 30° and preferably 18° to 20°.

56. In the apparatus of claim 17 and improvement further comprises means for holding the device through the effects of a vacuum applied to an outer face of the device, the holding means comprising a vacuum tube through which the vacuum is directed, the tube having a curvature allowing a relatively unobstructed view of the device and of the nozzles when viewed from directly above the nozzles.

57. In the apparatus of claim 56 and improvement further comprises spring means carried by the vacuum tube for pulling a device from the substrate immediately upon melting of the bonding material.

58. In the apparatus of claim 56 wherein the improvement further comprises contact means carried by the vacuum tube at the end thereof proximate to the device for sealingly contacting and holding the device on application of vacuum through the vacuum tube.

59. In the apparatus of claim 17 wherein the improvement further comprises image splitting means for simultaneously directing images of the device and of the nozzles to a viewing location, the image splitting means comprising split mirrors retractably interposed between the surface mount device and the nozzles and acting to superimpose images of the device and of the nozzles at the viewing location.

60. In the apparatus of claim 59 and further comprising means disposed at the viewing location and being connected to the apparatus for viewing the device and the nozzles juxtaposed relative thereto.

61. In the apparatus of claim 60 wherein the viewing means comprise a video camera disposed at the viewing location and wherein the improvement further comprises a video monitor connected to the video camera for remote viewing of the device and the nozzles.

62. In the apparatus of claim 17 wherein the moving means comprise means for simultaneously controlling the sweep range of each pair of oppositely disposed nozzles, thereby to allow use of the apparatus with devices of differing edge dimension.

63. In the apparatus of claim 17 wherein the nozzle assembly further comprises at least one heat shield mounted over each nozzle the heating means comprises and a heater mounted to each nozzle for heating the nozzle, the heater being mounted within the heat shield.

64. In the apparatus of claim 63 and further comprising a second heat shield mounting interiorly of the first-mentioned heat shield, the nozzle being carried within the second heat shield.

65. In the apparatus of claim 63 and further comprising adjustment means carried by the heat shield for adjusting the position of the nozzle within the heat shield.

66. In the apparatus of claim 63 and further comprising means carried by the nozzle for indicating the heat level present in the nozzle.

67. In the apparatus of claim 17 wherein the moving means comprise means for simultaneously controlling the position of each pair of oppositely disposed nozzles.

68. In the apparatus of claim 17 wherein the improvement further comprises means disposed above the plane in which the device lies and being connected to the apparatus, for viewing the device and the nozzles juxtaposed relative thereto.

69. In the apparatus of claim 68 wherein the viewing means comprise a video camera and a video monitor.

70. In the apparatus of claim 17 wherein the angle of the nozzles relative to the vertical is within the range of 18° to 30° and preferably 18° to 20°.

71. In the apparatus of claim 22 wherein the moving means comprise means for simultaneously controlling the position of each pair of oppositely disposed nozzles.

* * * * *